United States Patent
Duraffourg et al.

(10) Patent No.: US 8,115,556 B2
(45) Date of Patent: Feb. 14, 2012

(54) RESONANT DEVICE WITH IMPROVED FEATURES

(75) Inventors: Laurent Duraffourg, Voiron (FR); Philippe Andreucci, Moirans (FR); Eric Colinet, Meylan (FR); Sebastien Hentz, Grenoble (FR); Eric Ollier, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 52 days.

(21) Appl. No.: 12/710,678

(22) Filed: Feb. 23, 2010

(65) Prior Publication Data

US 2010/0219893 A1 Sep. 2, 2010

(30) Foreign Application Priority Data

Feb. 27, 2009 (FR) ...................... 09 00904

(51) Int. Cl.
*H03L 7/00* (2006.01)

(52) U.S. Cl. ........... 331/2; 331/154; 331/107 T; 331/56; 331/46

(58) Field of Classification Search ............... 331/107 T, 331/107 P, 56, 2, 154, 149, 46
See application file for complete search history.

(56) References Cited

U.S. PATENT DOCUMENTS 2,595,652 A 5/1952 Fisk et al.
3,378,789 A 4/1968 Gerlach

FOREIGN PATENT DOCUMENTS

FR 2 336 788 7/1977
FR 2 533 777 3/1984
WO WO 2007/135064 A1 11/2007

OTHER PUBLICATIONS

Bargatin, L et al., "Efficient Electrothermal Actuation of Multiple Mode of High-Frequency Nanomechanical Resonators," Applied Physics Letters, 2007, vol. 90, pp. 093116-1-093116-3.
Colinet, F. et al., "Measurement of Nano-Displacement Based on In-Plane Suspended-Gate MOSFET Detection Compatible with a Front-End CMOS Process," ISSCC, 2008, vol. 18.2, pp. 332-333 and 617.
Feng, X. at al., "A Self-Sustaining Ultrahigh-Frequency Nanoelectromechanical Oscillator," Nature Nanotechnology, Jun. 2008, vol. 3, pp. 342-346.

*Primary Examiner* — Arnold Kinkead
(74) *Attorney, Agent, or Firm* — Oliff & Berridge, PLC

(57) ABSTRACT

The device resonant comprises a plurality of synchronized oscillators. Each oscillator comprises a resonator which comprises detection means providing detection signals representative of oscillation of the resonator to a feedback loop connected to an excitation input of the resonator. The detection signals control the conductivity of the feedback loop of the oscillator. The excitation inputs of all the resonators are connected to a common point which constitutes the output of the resonant device. A capacitive load is connected between said common point and a reference voltage.

8 Claims, 2 Drawing Sheets

RESONANT DEVICE WITH IMPROVED FEATURES

BACKGROUND OF THE INVENTION

The invention relates to a resonant device.

STATE OF THE ART

In order to be able to continue the race towards miniaturization, micro-electronic circuits are having to integrate new functions while at the same time minimizing the surface area of the circuits. One of the major fields of study is integration of resonant devices within chips. Indeed, in a large number of fields such as gas-phase chemical sensors, molecular force sensors or mass spectrometers, it is of interest for the integrated circuit to comprise at least one oscillator. Designers are working on replacing the oscillator, which is an additional discrete component, by an integrated oscillator. By integrating this oscillator, it can then be hoped to obtain a gain in the energy consumed, in addition to the gain in surface area or in volume of the device, and an improvement of performances.

Numerous publications deal with electromechanical resonators of micrometric or nanometric size, i.e. resonators having dimensions compatible with those of integrated circuits. An article by Feng et al. "A self-sustaining ultrahigh-frequency nanoelectromechanical oscillator" Nature nanotechnology, vol. 3, June 2008, describes an oscillator that comprises an electromechanical resonator of nanometric size associated with a complex feedback circuit.

The performances of this type of oscillator are however greatly insufficient, and a new architecture then has to be found that is capable of improving the characteristics of the oscillator.

OBJECT OF THE INVENTION

The object of the invention consists in providing a resonant device that is easy to implement and that presents enhanced performances compared with known oscillators.

The device according to the invention is characterized in that it comprises a plurality of synchronized oscillators, each oscillator comprising a resonator comprising detection means providing detection signals representative of the oscillation of the resonator to a feedback loop connected to an excitation input of the resonator, the detection signals controlling the conductivity of said feedback loop of the oscillator, the excitation inputs of all the resonators being connected to a common point constituting the output of the resonant device, a capacitive load being connected between said common point and a reference voltage.

BRIEF DESCRIPTION OF THE DRAWINGS

Other advantages and features will become more clearly apparent from the following description of particular embodiments of the invention given for non-restrictive example purposes only and represented in the accompanying drawings, in which.

DESCRIPTION OF PREFERRED EMBODIMENTS OF THE INVENTION

Figure 1:
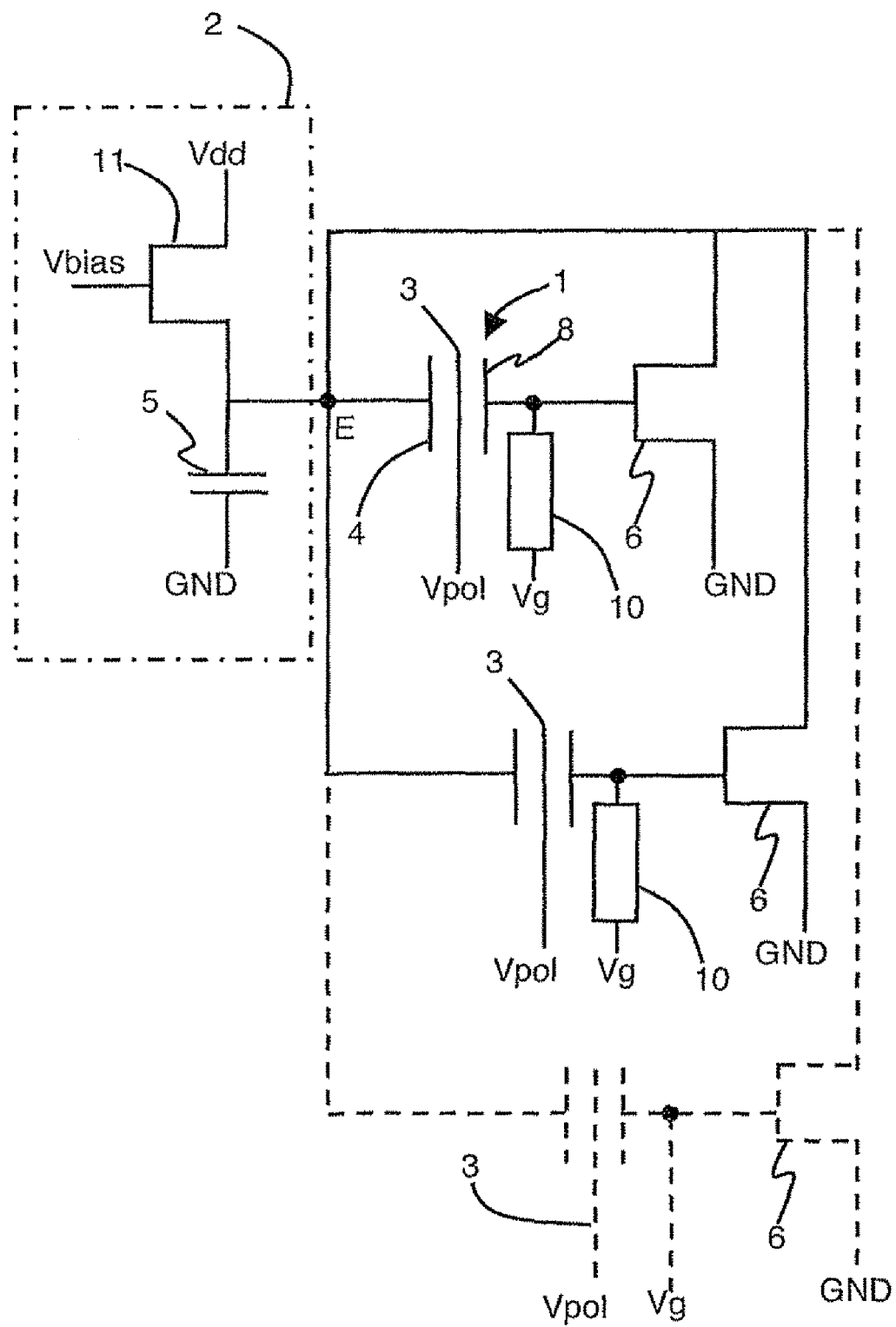
FIGS. 1 and 2 represent two particular embodiments of a device in schematic manner.

As illustrated in FIG. 1, the resonant device comprises a plurality of oscillators, at least two oscillators, that are synchronized. Each oscillator comprises a resonator 1 and its associated oscillation circuit which comprises a capacitive bias element 2. Bias element 2 is common to all the oscillators and comprises at least one capacitive load 5.

The oscillators forming the resonant device are simply electrically connected to one another. Each oscillator is dimensioned so as to present the same resonance frequency. The differences that exist between the resonance frequencies stem from the uncertainties in the production method, and these differences between the resonance frequencies can be compensated by adjusting the gain of their feedback loop. This adjustment of each gain is not a necessary condition but an advantageous embodiment.

Resonator 1 can for example be a quartz resonator, an electromechanical resonator advantageously of micrometric or nanometric size, or an electric resonator such as a passive circuit of RLC type. The resonator comprises oscillation excitation means and detection means. Resonator 1 comprises an excitation input E that acts on the excitation means.

If the resonator is mechanical, it comprises a mobile element 3 and at least one fixed element 4. Mobile element 3 can oscillate with respect to fixed element 4. Fixed element 4 represents at least the excitation means of mobile element 3 of resonator 1. The excitation means are thus considered to form an integral part of resonator 1. Excitation input E, also called excitation terminal, therefore controls the excitation force in resonator 1 emitted by fixed element 4, also called excitation electrode.

The excitation means are advantageously of capacitive type or of thermo-elastic type, but they can also be of another type suitable for actuation of mobile element 3.

In a general manner, the oscillator comprises detection means of oscillation within the resonator, either of an electric signal or of a mechanical movement of the mobile element. More particularly, the oscillator comprises detection means of movement of mobile element 3 with respect to fixed element 4. The detection means convert the movement of mobile element 3 into an electric signal which is then a signal representative of the position of mobile element 3 with respect to fixed element 4. The detection means transmit a signal representative of oscillation of resonator 1.

As illustrated in FIG. 1, in a particular embodiment, it is possible to use a resonator 1 that has an additional fixed element 8. This additional fixed element 8 can be associated with an additional excitation terminal. The additional fixed element can also be a detection electrode for improved decoupling of the excitation and detection signals. A bias voltage Vg is then applied to additional fixed element 8 to achieve enhanced control the characteristics of the resonator 1. The bias voltage Vg enables the operating point of the transistor to be controlled. The additional excitation electrode is only usable for excitation of capacitive type. The fixed element can comprise the detection means and then be associated with detection terminal D.

In the example of FIG. 1, detection is of capacitive type, and the resonator can therefore be assimilated to a variable capacitance. This variable capacitance is obtained by means of the use of fixed electrodes 4 and 8 to enable excitation and detection in the resonator. If the resonator only comprises a single fixed electrode 4, detection of movement is then performed by means of mobile element 3.

The detection means are advantageously of capacitive type or of piezo-resistive type, but they can also be of another type suitable for measuring the position of mobile element 3.

To form an oscillator, the signal emitted by the detection means, which can be representative of the movement of mobile element 3 of resonator 1, has to be transformed, in general amplified and phase shifted, so that the oscillation conditions are fulfilled. The transformed representative signal is then re-injected into resonator 1 by means of the excitation means, i.e. via its excitation terminal E.

Transformation of the signal is performed in a feedback loop which connects the detection means to excitation terminal E and by the fact that bias element 2 comprises a capacitive load 5, here a capacitor. The current signal originating from resonator 1, provided by the detection means, is amplified in voltage and phase shifted by 90° or $\pi/2$ by means of capacitive bias element 2. Capacitor 5 can advantageously be formed by a stray capacitance that comes from the interconnection tracks.

The feedback loop can be produced using CMOS technology, i.e. by means of field effect transistors of P and N type, or in bipolar technology, or in BiCMOS technology which comprises both the above two technologies at the same time. The feedback loop can also be formed by a passive electric circuit of RLC type.

The detection means thus provide detection signals representative of oscillation of the resonator to the feedback loop which is connected to excitation input E of resonator 1.

Excitation terminals E of all the resonators are connected to a single common point, an electric node, which constitutes the output terminal of the resonant device enabling synchronization of the oscillators to be achieved, which oscillators then all start oscillating in phase on a common frequency. All the oscillators are connected to one and the same capacitive load 5 enabling synchronization of the oscillators without having to use a mechanical and/or electromagnetic coupling. There is therefore no mechanical coupling nor is there any electrostatic coupling between the different oscillators. As all the excitation terminals E of the resonators are connected to one and the same common point, this common point can then be considered to represent an excitation terminal common to all the resonators although the terminals are physically distinct.

The electric current of each feedback loop is applied to excitation terminal E, i.e. the sum of the currents is applied to capacitive bias element 2 which then applies a voltage representative of this sum to the whole set of resonators.

Each resonator thereby has its own gain stage formed by its own feedback loop. The oscillation frequency generated by the resonant device corresponds to the common frequency which complies with the oscillation condition for each oscillator. Here, any modification of the state of one of the oscillators induces a modification of the oscillation conditions of all the oscillators, as the excitation terminal is common to all the oscillators. Resonance frequency adjustment can therefore be performed easily. Operation is therefore different compared with a device that comprises a network of several resonators which are looped back on one another and for which there is only a single possible oscillation condition.

In this way, the resonant device has rugged functioning as far as a possible dispersion of frequencies between the oscillators is concerned. In fact the gain of the different feedback loops simply has to be modified to achieve synchronization. This modification is obtained by modulating bias voltages Vg of the different oscillators.

The use of a device comprising a plurality of oscillators operating at the same frequency enables the phase noise to be reduced, typically by the root of the number of oscillators, which is all the more realistic as the noise inherent to each oscillator is totally non-correlated and the resonance frequencies of the resonators do not present any dispersion.

Furthermore, the amplitude of the global output signal that is delivered on excitation terminal E is the sum of the amplitudes of each oscillator (if all the oscillators have exactly the same oscillation frequency). The gain necessary for the feedback loop is therefore inversely proportional to the number of oscillators that are used in the resonant device. This approach therefore enables the architecture of the feedback loop to be simplified, which loop can then be reduced to a first transistor or to a first and second transistor connected in series.

The oscillation conditions are conventionally defined by the Barkhausen conditions. This results in the product of the transfer function H of the resonator by the transfer function G of the electronic circuit that is associated thereto having to have a gain at least equal to one, and the phase difference between the signals coming from resonator 1 and from the feedback loop having to be equal to $2 \cdot k \cdot \pi$ with k an integer, at the resonance frequency.

Transfer function H of resonator 1 takes account of the mechanical characteristics of resonator 1 and of the transfer function of the excitation means. Transfer function H of resonator 1 is a function of the mass, of the stiffness, and of the damping coefficient, i.e. of the geometrical parameters of the resonator and of its embedment conditions.

The transfer function of the associated circuit corresponds to the transfer function of the feedback loop and of the detection means. If the detection and excitation means are considered as being gains K, the Barkhausen conditions can be redefined in the following manner:

it is sufficient for the feedback loop to perform a phase shift equal to $\pi/2$ between the signal entering the feedback loop and the signal exiting the feedback loop and for the modulus of the associated circuit to be equal to the formula $$\|G(j\omega_0)\| = \frac{m_{\mathit{eff}}\omega_0^2}{K_{detect}, K_{excit}, Q}$$

in which:
$m_{\mathit{eff}}$ is the effective mass of the resonator,
$\omega_0$ is the resonance frequency,
$K_{detect}$ is the gain of the detection means,
$K_{excit}$ is the gain of the excitation means,
Q is the quality factor.

It results therefrom that, to form an oscillator, the feedback loop has to comprise devices that are able to perform the above phase shift and to ensure a sufficient gain to obtain self-sustained oscillations.

The feedback loop is connected between a reference voltage GND and excitation terminal E. The signals representative of oscillation of the resonator are applied to the feedback loop and modulate the conductivity of the latter. The feedback loop can be achieved by any known circuit enabling the input signal to be amplified.

Figure 2:
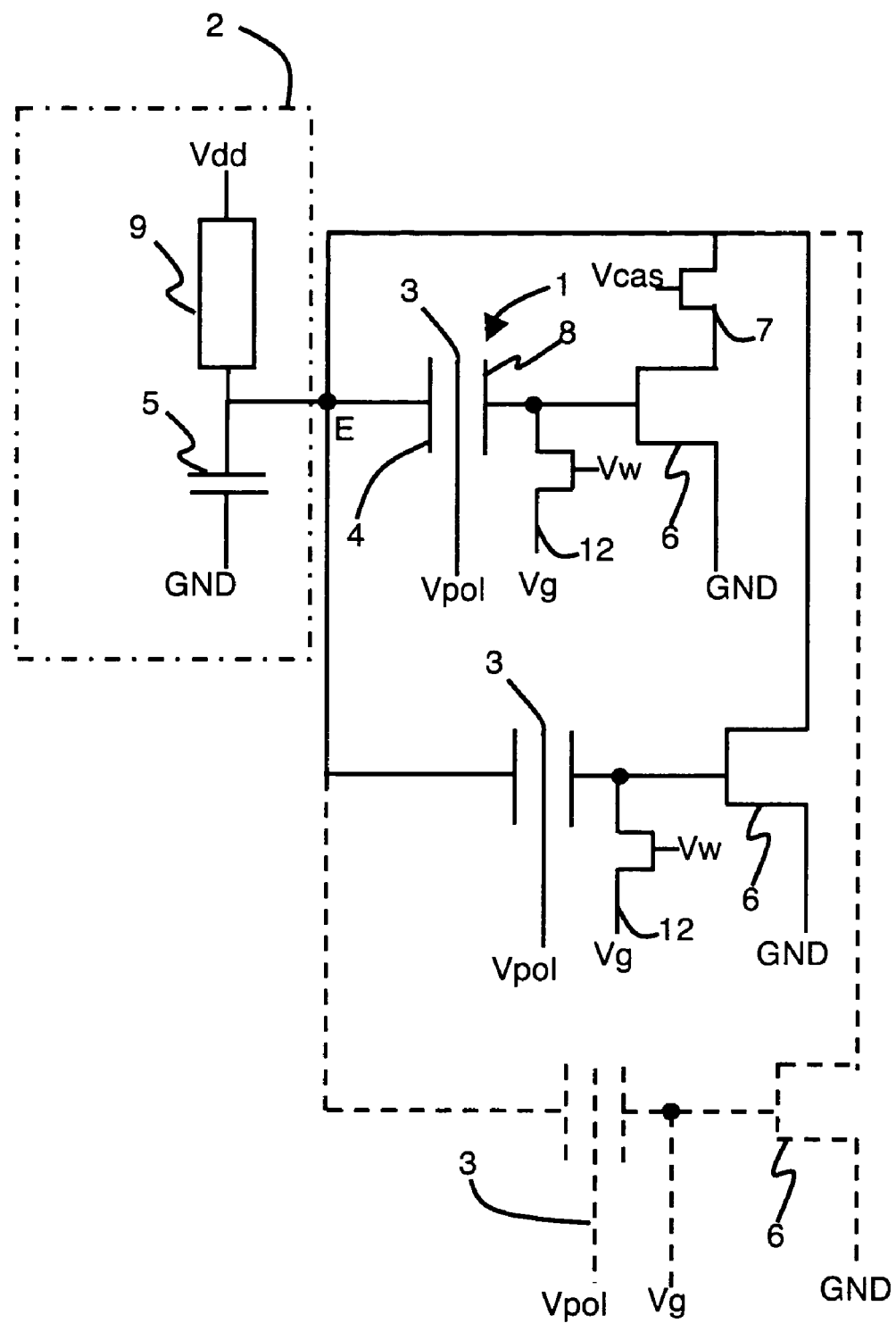

In the case of a resonator of electromechanical type of nanometric or micrometric size, the feedback loop can be formed by a first transistor 6 or by a first transistor 6 and second transistor 7 connected in series (FIG. 2), or comprise at most these two transistors connected in series. Second transistor 7 is an amplification transistor that enables the value of the current that is delivered on output from first transistor 6 to be amplified. As illustrated in FIG. 2, the control electrode of second transistor 7 is connected to an external voltage Vcas.

In the oscillator, first transistor 6 is connected between a reference voltage GND and excitation terminal E. A second transistor 7 can also be connected in series with first transistor 6 between reference voltage GND and excitation terminal E.

First transistor 6 and second transistor 7 can be independently of field effect or bipolar type. First transistor 6 and second transistor 7 can thus be of the same type or of different types.

If first transistor 6 is of field effect type, a first source/drain electrode of first transistor 6 is connected to reference voltage GND. A second source/drain electrode is connected to excitation terminal E directly or by means of second transistor 7.

In the case of excitation and detection by capacitive means, it is advantageous to use two distinct electrodes, i.e. two fixed elements 4 and 8, arranged on each side of resonator 1. One 4 of the electrodes performs excitation of mobile element 3 and the other electrode 8 performs detection of movement of mobile element 3. In this way, the electrostatic couplings are greatly reduced between the two electrodes.

The conductivity of first transistor 6 is controlled by the detection signals emitted by the detection means. Thus, depending on the position of mobile element 3 with respect to fixed element 4, the amplitude of the detection signal varies and makes the electric current flowing between the two terminals of first transistor 6 vary.

Resonator 1 can be with in-plane movement or with out-of-plane movement. Resonator 1 can for example be a resonator of embedded-free beam type (single embedment) or embedded-embedded beam type (double embedment), or of any other known type, for example of plate, disk, or nanowire type.

The use of a feedback loop only comprising at most two transistors 6 and 7 is particularly advantageous as it enables the feedback loop to be integrated very close to resonator 1, which enables the surface area occupied by the oscillator to be greatly reduced. Furthermore, stray capacitances are also greatly reduced, these capacitances being responsible for a loss of useful signal and the occurrence of background noise preventing any possible oscillation. The feedback loop comprises at most two transistors but it can also, in particular cases, comprise passive elements such as for example resistors or capacitors.

First transistor 6 being located very close to resonator 1, the influence of stray capacitances is negligible with regard to the input capacitance of transistor 6 and to the static capacitance of resonator 1.

Biasing of first transistor 6 is achieved by means of bias element 2 which is connected with first transistor 6 or second transistor 7 to excitation terminal E.

In a particular embodiment of the oscillator, excitation and detection are of capacitive type. As illustrated in FIG. 1, the feedback loop is formed by first transistor 6 whose control electrode, its gate or base electrode, is connected to the detection means. In this way, the detection means modulate the conductivity of first transistor 6. The current delivered by first transistor 6 can be amplified or not to control the actuating force produced by the excitation means.

In another particular embodiment, the resonator 1, excitation means and detection means can be formed by a suspended-gate transistor. This embodiment has in particular been described in an article by Colinet et al. "Measurement of Nano-Displacement Based on In-Plane Suspended-Gate MOSFET Detection Compatible with a Front-End CMOS Process" ISSCC 2008, 18.2 and in the document WO 2007135064. In this embodiment, first transistor 6 is a field-effect transistor and its gate is formed at least partially by mobile element 3 of resonator 1. This results in the MOS capacitance value between the channel and mobile element 3 varying according to the position of mobile element 3 with respect to the channel. The channel of first transistor 6 then acts as detection means, i.e. as fixed element 4, which controls the conductivity of first transistor 6

As illustrated in FIG. 1, for this type of oscillator, bias element 2 can comprise a capacitor 5 connected in series with a bias resistor 9 to the terminals of a power supply. In this case, the terminal common to resistor 9 and capacitor 5 is connected to excitation terminal E.

In these two foregoing embodiments, mobile element 3 can be biased by means of a bias voltage Vpol so as to modulate the oscillation characteristics of the resonator.

As illustrated in FIG. 2, it is also possible as a variant to replace bias resistor 9 by a third transistor 11 that is connected between excitation terminal E and supply voltage Vdd. In this case, control voltage Vbias applied on the control terminal of the third transistor enables the bias current to be adjusted. The preset voltage Vs applied to the control electrode of third transistor 11 enables the operating regime of the transistor to be fixed. Control voltage Vbias can be equal to that of excitation terminal E, the control electrode then being connected to the excitation terminal. It is also conceivable to use an external power source for fixing control voltage Vbias.

In another alternative embodiment, first transistor 6 is biased by means of an additional resistor 10 that is connected between detection terminal D and the control electrode of first transistor 6. In a particular embodiment illustrated in FIG. 2 and that can be combined with the other embodiments described, it is also possible to achieve this additional resistor by means of a fourth transistor 12. The preset voltage Vw that is applied to the control electrode of fourth transistor 12 is a constant voltage. This second preset voltage Vw is advantageously equal to that of additional fixed element 8 or alternatively a voltage originating from an external source.

In yet another embodiment, it is also possible to achieve an oscillator that is formed by a resonator 1 excited by capacitive means and detection of movement of which is performed by piezoresistive means, for example in an out-of-plane movement.

In this embodiment, the excitation electrode is advantageously arranged underneath mobile element 3, typically a double-embedded (embedded-embedded) beam. A piezoresistive force gauge is arranged on the beam, and when the latter deforms the gauge sees its resistance vary. It is thereby possible to detect movement of the beam by measuring the resistance of the gauge.

As in the previous embodiments, the transconductance of transistors 6 and 7 of the feedback loop has to take account of the gains of the detection means of piezoresistive type and of the gains of the excitation means. The trans-conductance also has to take account of the phase noises associated with the resonator, with first transistor 6, with second transistor 7 if applicable, and with the piezoresistive sensor.

In another embodiment, it is also conceivable to achieve an oscillator that comprises a resonator 1 with capacitive actuation and piezoresistive detection. This resonator can for example have an in-plane movement. The leverage arm of resonator 1 is actuated by an electrostatic force and its oscillation movement induces compression/expansion stresses in the sensors placed perpendicularly to this leverage arm.

In a variant of the previous embodiment, resonator 1 is formed by a nanowire. Excitation is performed by capacitive means and detection is performed by piezoresistive means. The nanowires do in fact present a very great piezoresistive effect which enables a very high transductance gain of the detection means to be obtained. This embodiment is particularly advantageous as the electronic gain that the feedback loop has to provide is all the lesser. The resonator can be obtained using the nanowire as variable resistance connected to first transistor 6, the resistance variation being induced by deformation of the nanowire.

In yet another embodiment, the excitation means are of thermal type whereas the detection means are of piezoresistive type. Such an implementation has been proposed by Bargatin et al. "Efficient electrothermal actuation of multiple mode of high-frequency nanomechanical resonators", Applied Physics Letters 90, 2007. If the detection means are of piezoresistive type, the resonator can be assimilated to a variable resistance.

In cases where detection is of piezoelectric type, the resonator can be assimilated to a variable load.

The topology of the oscillator is of Colpitts type, and first transistor 6 or first transistor 6 and second transistor 7 are biased by means of capacitive bias element 2. Bias element 2 then acts as a transimpedance amplifier which is used to convert the dynamic current coming from resonator 1 into a suitable voltage on excitation terminal E.

An amplification voltage Vcas is applied to the control electrode of second transistor 7 so as to be able to adjust the current emitted on output thereof and therefore the bias applied on excitation terminal E.

This architecture constitutes a co-integrated hybrid resonator/first transistor active component dedicated to the oscillator function. The different elements of the oscillator are then biased to fix the gain of first field-effect transistor 6 and phase shifting of the signal.

This circuit is particularly advantageous as the reduction of size of resonator 1 enables a mobile element to be obtained that is situated in immediate proximity to the fixed detection and excitation elements. Due to this size reduction, the gains of the transduction devices are then as a result greatly increased, particularly with the use of a nanowire. The feedback loop therefore has to present a natural gain that is typically that of a transistor or of two transistors in series.

The oscillation frequency of the resonant device can be adjusted in two ways. The first method is advantageously implemented for use of the device in time-based applications, typically formation of a reference frequency in a radiofrequency application, for example a carrier frequency. This first method consists in applying a bias Vpol on the mechanical part of the resonator, in addition to the electric signal emitted by the feedback loop.

This bias induces an electrostatic stress in the resonator. This electrostatic stress modifies the mechanical properties of the resonator and therefore its oscillation frequency. This method can be applied on a single resonator, on several predefined oscillators or on all the oscillators with different biases from one another. By cumulating all or part of the different frequency adjustments of the oscillators, the global oscillation frequency of the resonant device can easily be adjusted. Access can then be had to an adjustment range that is much greater than for a single oscillator.

The second method consists in adjusting the gain of one or more feedback loops. As in the previous method, this results at the outcome in easy adjustment of the global oscillation frequency of the resonant device. For example, adjustment of the gain can be achieved by adjusting bias voltage Vg, typically applied by means of additional resistor 10. This totally electrical method is simple to implement, but it requires addressing of each oscillator.

In the particular embodiment where the resonant device is used as a mass sensor, any mass placing itself on one of the electromechanical oscillators will induce a modification of the global frequency of the output signal. The influence of the noise being reduced by means of use of a plurality of oscillators, the device then presents a considerably enhanced resolution compared with known devices of the prior art.

Advantageously, to produce a mass sensor, the resonator and therefore the oscillator is of nanometric or micrometric size.

Furthermore, on account of its simplicity of implementation, the resonant device can easily be achieved within an integrated circuit while at the same time keeping a size compatible with that of the integrated circuit.

The resonant device can be coupled to a temperature compensation circuit via bias voltages Vpol and Vg as the resonance frequency is a temperature-dependent characteristic.

The invention claimed is:

1. A resonant device comprising a plurality of synchronized oscillators, each oscillator comprising a electromechanical resonator comprising detection means providing detection signals representative of oscillation of the resonator to a feedback loop connected to an excitation input of the resonator, the detection signals controlling a conductivity of said feedback loop of the oscillator, the excitation inputs of all the resonators being connected to a common point constituting an output of the resonant device, a capacitive load being connected between said common point and a reference voltage.

2. Device according to claim 1, wherein the resonator is a quartz resonator.

3. Device according to claim 1, wherein the resonator is of variable capacitance, variable resistance or variable load type.

4. Device according to claim 1, wherein the resonator is of nanometric or micrometric size.

5. Device according to claim 1, wherein each feedback loop is formed by a first transistor or by a first transistor and second transistor connected in series between a reference voltage and the excitation input.

6. Device according to claim 5, wherein a corresponding voltage is applied on each control electrode of the first transistor.

7. Device according to claim 1, wherein a bias resistor is connected between the excitation input and a supply voltage.

8. Device according to claim 5, wherein a third transistor is connected between the excitation input and a supply voltage.

* * * * *